United States Patent
Hattori

(10) Patent No.: US 10,421,219 B2
(45) Date of Patent: Sep. 24, 2019

(54) IMPRINT APPARATUS AND METHOD OF MANUFACTURING ARTICLE

(71) Applicant: CANON KABUSHIKI KAISHA, Tokyo (JP)

(72) Inventor: Tadashi Hattori, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 290 days.

(21) Appl. No.: 14/986,935

(22) Filed: Jan. 4, 2016

(65) Prior Publication Data
US 2016/0193759 A1 Jul. 7, 2016

(30) Foreign Application Priority Data
Jan. 5, 2015 (JP) .................................. 2015-000512

(51) Int. Cl.
*B29C 43/58* (2006.01)
*B29C 33/42* (2006.01)
(Continued)

(52) U.S. Cl.
CPC ............ *B29C 43/58* (2013.01); *G03F 7/0002* (2013.01); *B29C 33/424* (2013.01);
(Continued)

(58) Field of Classification Search
CPC .... B29C 2043/5825; B29C 2043/5833; B29C 33/424; B29C 43/58; B29C 33/46;
(Continued)

(56) References Cited

U.S. PATENT DOCUMENTS

| 7,658,601 | B2 | 2/2010 | Kasumi | |
|---|---|---|---|---|
| 2005/0064054 | A1* | 3/2005 | Kasumi | B82Y 10/00 425/112 |
| 2013/0015597 | A1* | 1/2013 | Hattori | G03F 7/0002 264/40.1 |

FOREIGN PATENT DOCUMENTS

| CN | 102929099 A | 2/2013 |
|---|---|---|
| JP | 2005-101201 A | 4/2005 |
| (Continued) | | |

OTHER PUBLICATIONS

Office Action issued in Japanese Appln. No. 2015-000512 dated Oct. 22, 2018.
(Continued)

*Primary Examiner* — Matthew J Daniels
*Assistant Examiner* — Yunju Kim
(74) *Attorney, Agent, or Firm* — Rossi, Kimms & McDowell LLP

(57) ABSTRACT

The present invention provides an imprint apparatus which forms a pattern on an imprint material on a substrate by using a mold, the apparatus comprising a measurement unit configured to measure an inclination of a surface of the substrate at a second position different from a first position where the mold is brought into contact with the imprint material, and a control unit configured to control at least one of inclinations of a surface of the mold and the surface of the substrate when bringing the mold into contact with the imprint material at the first position, wherein the control unit controls at least one of the inclinations based on information representing inclinations of a surface of a reference substrate at the first position and the second position, and a measurement result obtained by the measurement unit.

17 Claims, 12 Drawing Sheets

(51) Int. Cl.
*G03F 7/00* (2006.01)
*B29L 31/34* (2006.01)

(52) U.S. Cl.
CPC ............... *B29C 2043/5825* (2013.01); *B29C 2043/5833* (2013.01); *B29L 2031/34* (2013.01)

(58) Field of Classification Search
CPC ... B29C 59/02; B29L 2031/34; G03F 7/0002; H01L 21/02318
USPC .............. 264/40.5, 40.1; 425/112, 150
See application file for complete search history.

(56) References Cited

FOREIGN PATENT DOCUMENTS

| | | | |
|---|---|---|---|
| JP | 2006165371 | A | 6/2006 |
| JP | 2007-173614 | A | 7/2007 |
| JP | 2013055327 | A | 3/2013 |
| JP | 2013062286 | A | 4/2013 |

OTHER PUBLICATIONS

Office Action issued in Chinese Appln. No. 201610006914.8 dated Mar. 28, 2019. English translation provided.
Office Action issued in Korean Appln. No. 10-2016-0000222 dated Feb. 15, 2019.

\* cited by examiner

IMPRINT APPARATUS AND METHOD OF MANUFACTURING ARTICLE

BACKGROUND OF THE INVENTION

Field of the Invention

The present invention relates to an imprint apparatus and a method of manufacturing an article.

Description of the Related Art

An imprint apparatus which forms a pattern on an imprint material on a substrate by using a mold having a pattern surface on which a pattern is formed has attracted attention as one of mass production lithography apparatuses for semiconductor devices and the like. The imprint apparatus cures an imprint material on a substrate while a mold is in contact with the imprint material, and separates the mold from the cured imprint material, thereby forming a concave-convex pattern on the imprint material on the substrate.

The imprint apparatus may make the "residual layer thickness of an imprint material" uniform on a substrate. This residual layer thickness indicates the thickness of the imprint material between the substrate and a concave portion of a concave-convex pattern formed on the imprint material. For this purpose, the relative inclination between the pattern surface of the mold and the surface of the substrate may be controlled so as to a target relative inclination (e.g., parallel) when bringing the mold into contact with the imprint material. Japanese Patent Laid-Open No. 2005-101201 discloses an example of a method of controlling the relative inclination between the pattern surface of a mold and the surface of a substrate based on a result obtained by measuring the inclination of the surface of the substrate.

With an increase in the complexity of the apparatus arrangement of an imprint apparatus, it is more difficult to arrange a measurement unit for measuring the inclination of the surface of a substrate near a contact position where a mold is brought into contact with an imprint material. Therefore, the measurement unit may be arranged such that the inclination of a substrate is measured at a position (measurement position) different from a contact position. The inclination of the surface of the substrate at the contact position can be controlled based on a measurement result obtained by measuring the inclination of the surface of the substrate using the measurement unit at the measurement position. However, for example, there is a case that the distortion of a base plate, on which a stage holding a substrate moves, is different between a contact position and a measurement position. In this case, controlling the inclination of the surface of the substrate at the contact position based on a measurement result obtained by the measurement unit arranged at the measurement position can make it difficult to accurately control the relative inclination between the pattern surface of a mold and the surface of the substrate.

SUMMARY OF THE INVENTION

The present invention provides, for example, an imprint apparatus which is advantageous in accurately controlling the relative inclination between the pattern surface of a mold and the surface of a substrate.

According to one aspect of the present invention, there is provided an imprint apparatus which forms a pattern on an imprint apparatus which forms a pattern on an imprint material on a substrate by using a mold, the apparatus comprising: a measurement unit configured to measure an inclination of a surface of the substrate at a second position different from a first position where the mold is brought into contact with the imprint material; and a control unit configured to control at least one of inclinations of a surface of the mold and the surface of the substrate when bringing the mold into contact with the imprint material at the first position, wherein the control unit controls at least one of the inclinations of the surface of the mold and the surface of the substrate based on information representing an inclination of a surface of a reference substrate at the first position and an inclination of the surface of the reference substrate measured by the measurement unit at the second position, and a measurement result of the substrate obtained by the measurement unit.

Further features of the present invention will become apparent from the following description of exemplary embodiments with reference to the attached drawings.

DESCRIPTION OF THE EMBODIMENTS

Figure 1:
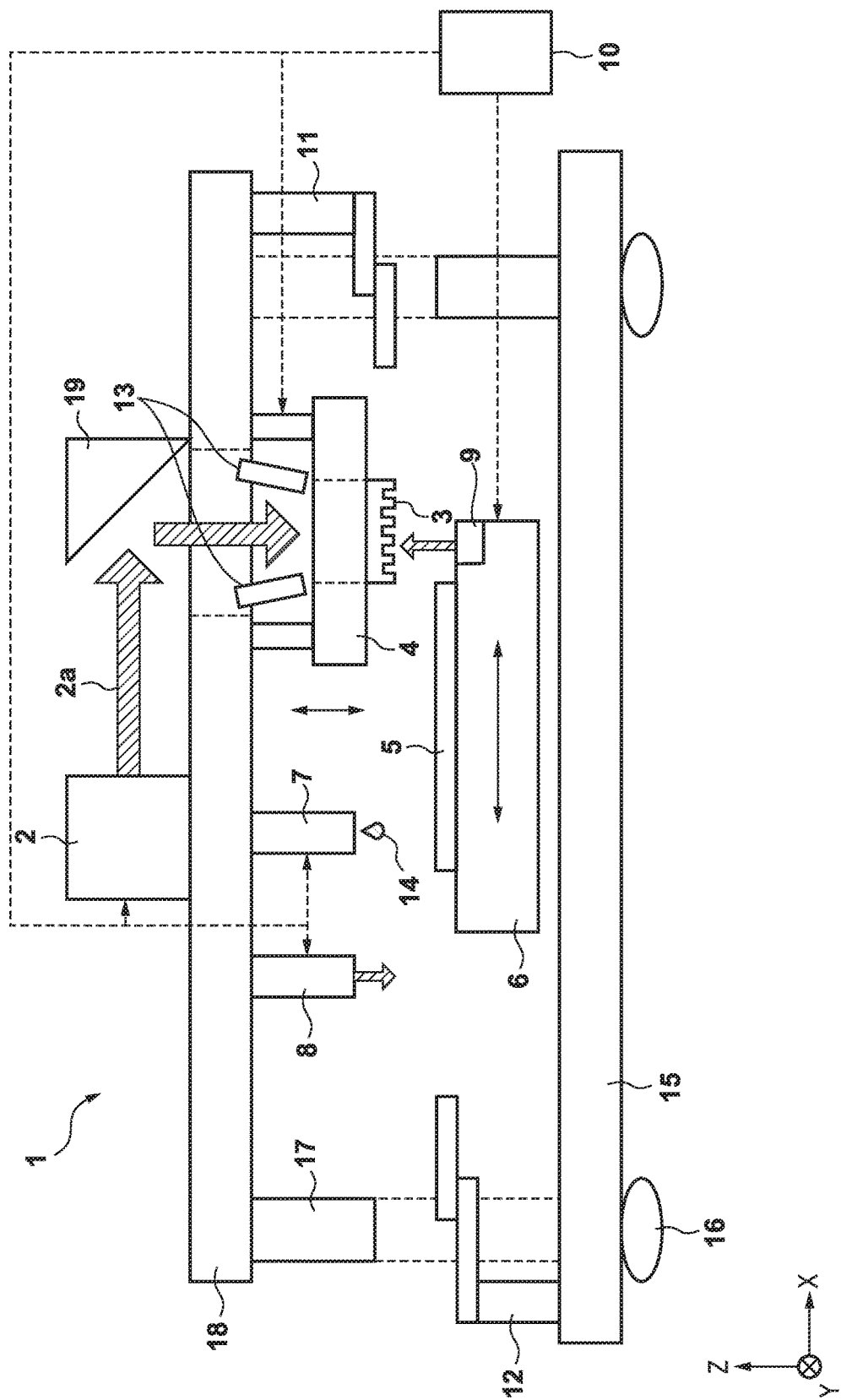
FIG. 1 is a schematic view showing an imprint apparatus according to the first embodiment.

Exemplary embodiments of the present invention will be described below with reference to the accompanying drawings. Note that the same reference numerals denote the same members throughout the drawings, and a repetitive description thereof will not be given.

<First Embodiment>

An imprint apparatus 1 according to the first embodiment of the present invention will be described with reference to FIG. 1. The imprint apparatus 1 is used to manufacture semiconductor devices and the like and configured to perform an imprint process of molding an imprint material 14 on a substrate by using a mold 3, on which a concave-convex pattern is formed, with respect to each of a plurality of shot regions formed on a substrate 5. For example, the imprint apparatus 1 cures the imprint material 14 while the mold 3 on which the pattern is formed is in contact with the imprint material 14 on the substrate. The imprint apparatus 1 then changes the distance between the mold 3 and the substrate 5 to separate (release) the mold 3 from the cured imprint material 14, thereby forming a concave-convex pattern on the imprint material 14 on the substrate. Methods of curing the imprint material 14 include a thermal cycle method using heat and a photo-curing method. The first embodiment will exemplify a case in which the photo-curing method is used. The photo-curing method is a method of curing the imprint material 14 by supplying an uncured curable composition as the imprint material 14 onto the substrate and irradiating the imprint material 14 with ultraviolet light while the mold 3 is in contact with the imprint material 14. In this case, as the imprint material 14, a material which is cured by being irradiated with ultraviolet light is used.

[Arrangement of Imprint Apparatus 1]

FIG. 1 is a schematic view showing the imprint apparatus 1 according to the first embodiment. The imprint apparatus 1 can include an irradiation unit 2, an imprint head 4, a substrate stage 6, a supply unit 7, a detection unit 13, a first measurement unit 8 (measurement unit), a second measurement unit 9, and a control unit 10. The control unit 10 includes, for example, a CPU and a memory, and controls an imprint process (controls the respective units of the imprint apparatus 1). In this case, the imprint head 4 is fixed to a bridge plate 18 supported by a base plate 15 through a column 17. The substrate stage 6 is configured to be movable on the base plate 15. In addition, the imprint apparatus 1 can be provided with an anti-vibration device 16 for reducing vibration transmitted from the floor, on which the imprint apparatus 1 is provided, to the base plate 15.

The mold 3 is made of a material which can transmit ultraviolet light, such as quarts. A concave-convex pattern for molding the imprint material 14 on the substrate is formed on the surface (pattern surface) of the substrate side. In addition, as the substrate 5, for example, a single-crystal silicon substrate is used, and the supply unit 7 (to be described later) supplies the imprint material 14 onto the surface (to be processed) of the substrate.

The irradiation unit 2 irradiates the imprint material 14 on the substrate with light 2a (ultraviolet light), which cures the imprint material 14, through the mold 3 when performing an imprint process. The irradiation unit 2 can include, for example, a light source and an optical element for adjusting light emitted from the light source to light appropriate for an imprint process. The imprint apparatus according to the first embodiment is configured to irradiate the imprint material 14 on the substrate with the light 2a emitted from the irradiation unit 2 and reflected by a mirror 19. In this case, for example, when using the thermal cycle method instead of the photo-curing method, a heat source unit for curing the imprint material 14 can be provided instead of the irradiation unit 2.

The imprint head 4 can include a mold chuck which holds the mold 3 conveyed by a mold conveying unit 11 and a mold driving unit configured to be able to change the position and inclination of the mold 3 held by the mold chuck. The mold driving unit can be configured to drive the mold 3 in a direction (to be referred to as a mold pressing direction (e.g., the Z direction)) to press the mold 3 against the imprint material 14 on the substrate and incline the mold 3. In addition, the substrate stage 6 is configured to hold the substrate 5 and be able to move on the base plate 15 between a contact position (first position) where the mold 3 is brought into contact with the imprint material 14 on the substrate and a measurement position (second position) where the first measurement unit 8 measures the inclination of the surface of the substrate 5. The substrate stage 6 can include, for example, a substrate chuck which holds the substrate 5 conveyed by a substrate conveying unit 12 and a substrate driving unit configured to be able to change the position and inclination of the substrate 5 held by the substrate chuck. In this case, the imprint apparatus 1 according to the first embodiment causes the imprint head 4 to move the mold 3 when changing the distance between the mold 3 and the substrate 5 so as to bring the mold 3 into contact with the imprint material 14 on the substrate. However, this is not exhaustive. For example, the substrate stage 6 may move the substrate 5 or both the imprint head 4 and the substrate stage 6 may relatively move the mold 3 and the substrate 5.

The detection unit 13 detects a mark provided on the mold 3 and a mark provided on the substrate 5 while the mold 3 is in contact with the imprint material 14 on the substrate. With this operation, the control unit 10 can obtain the relative position (X-Y direction) between the mark on the mold and the mark on the substrate based on the detection result obtained by the detection unit 13, and align the mold 3 with the substrate 5 so as to set the relative position to a target relative position. In addition, the supply unit 7 supplies the imprint material 14 onto the substrate. As described above, the imprint apparatus 1 according to the first embodiment uses a curable composition having the property of being cured by irradiation with ultraviolet light as the imprint material 14.

In this case, the imprint apparatus 1 may control the relative inclination between the pattern surface of the mold 3 and the surface of the substrate 5, when bringing the mold 3 into contact with the imprint material 14, so as to make the imprint material 14 formed by the mold 3 have a uniform residual layer thickness. For this purpose, the imprint apparatus 1 according to the first embodiment is provided with the first measurement unit 8 which measures the inclination of the surface of the substrate 5 and the second measurement unit 9 which measures the inclination of the surface of the mold 3. The residual layer thickness of the imprint material 14 is the thickness of the imprint material 14 between the substrate 5 and a concave portion of a concave-convex pattern formed on the imprint material 14, and is also called an RLT.

The first measurement unit 8 is arranged at a measurement position (second position) different from a contact position (first position) where the mold 3 is brought into contact with the imprint material 14 on the substrate, and measures the inclination of the surface of the substrate 5 at the measurement position. As shown in FIG. 1, the contact position and the measurement position differ from each other in the X-Y plane of the imprint apparatus 1. The first measurement unit 8 includes, for example, a laser interferometer which irradiates the surface of the substrate 5 with light (laser light), and can be configured to detect the height (a position in a direction parallel to the mold pressing direction) of a portion, on the surface of the substrate 5, which is irradiated with light. The control unit 10 then causes the first measurement unit 8 to detect the height of each of a plurality of portions on the surface of the substrate 5 while moving the substrate stage 6 (substrate 5) on the base plate 15. With this operation, the first measurement unit 8 can measure the inclination of the surface of the substrate 5 based on the detected height of each of the plurality of portions on the surface of the substrate 5.

The second measurement unit 9 measures the inclination of the pattern surface of the mold 3 at the contact position where the mold 3 is brought into contact with the imprint material 14 on the substrate. The second measurement unit 9 is provided on the substrate stage 6. In addition, the second measurement unit 9 includes a laser interferometer which irradiates the pattern surface with light (laser light), and can be configured to detect the height (a position in a direction parallel to the mold pressing direction) of a portion, on the pattern surface, which is irradiated with light. The control unit 10 causes the second measurement unit 9 to detect the height of each of a plurality of portions on the pattern surface of the mold 3 while moving the substrate stage 6 on the base plate 15. With this operation, the second measurement unit 9 can measure the inclination of the pattern surface of the mold 3 based on the detected height of each of the plurality of portions on the pattern surface.

[General Imprint Process]

Figure 2:
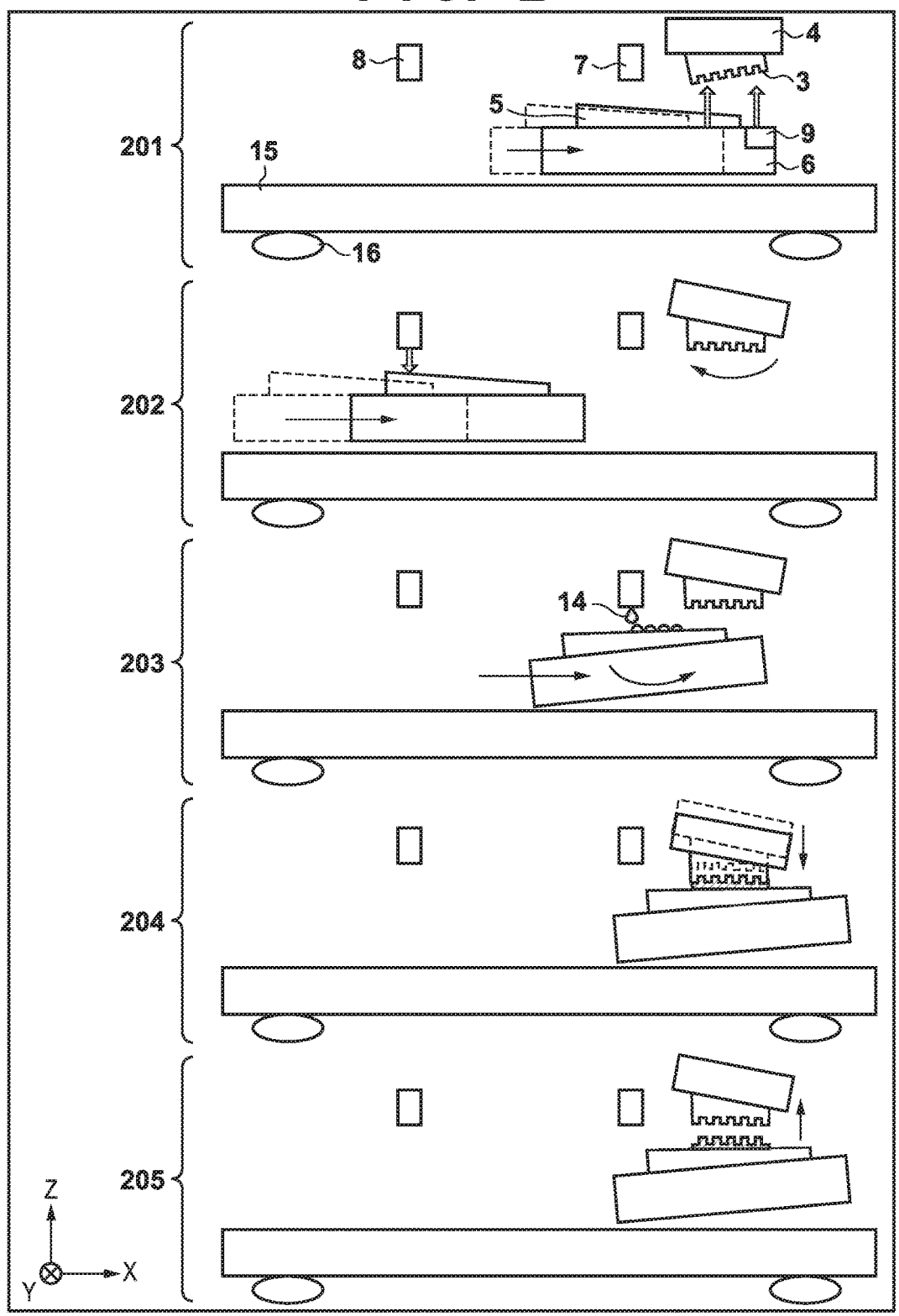
FIG. 2 is a view showing how the imprint apparatus performs a general imprint process.

A general imprint process performed by the imprint apparatus 1 having the above arrangement will be described with reference to FIG. 2. FIG. 2 is a view showing how a general imprint process is performed by the imprint apparatus 1. The control unit 10 causes the second measurement unit 9 provided on the substrate stage 6 to measure the inclination of the pattern surface of the mold 3 at the contact position by detecting the height of each of a plurality of portions on the pattern surface while moving the substrate stage 6 (201 in FIG. 2). The control unit 10 then causes the imprint head 4 to control the inclination of the pattern surface, based on the measurement result obtained by the second measurement unit 9, so as to make the pattern surface become perpendicular to the mold pressing direction. In addition, the control unit 10 causes the first measurement unit 8 to measure the inclination of the surface of the substrate 5 at the measurement position by detecting the height of each of a plurality of portions on the surface of the substrate 5, while moving the substrate stage 6 (substrate 5) (202 in FIG. 2). The control unit 10 then causes the substrate stage 6 to control the inclination of the surface of the substrate 5, based on the measurement result obtained by the first measurement unit 8, so as to make the surface of the substrate 5 become perpendicular to the mold pressing direction. Controlling the inclination of the pattern surface of the mold 3 and the inclination of the surface of the substrate 5 can bring the relative inclination between the pattern surface and the surface of the substrate close to a target relative inclination (for example, parallel) (203 in FIG. 2). Subsequently, a concave-convex pattern can be formed on the imprint material 14 on the substrate through the step of supplying the imprint material 14, the step of bringing the mold 3 into contact with the imprint material 14, and the step of releasing the mold 3 (203 to 205 in FIG. 2).

Figure 3:
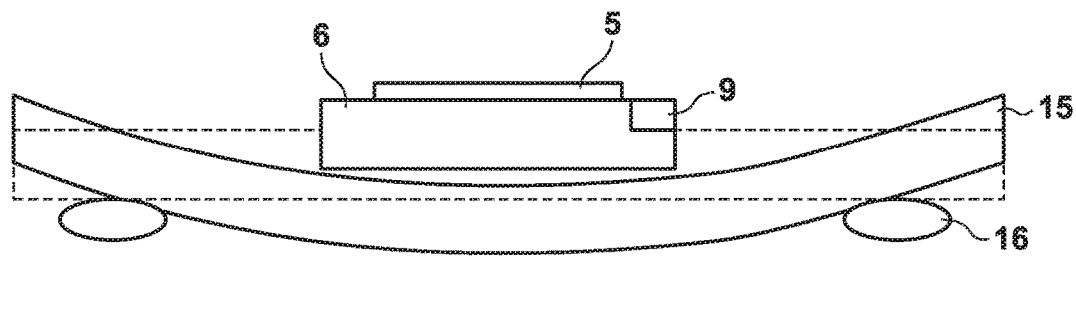
FIG. 3 is a view showing a state in which distortion is caused in a base plate.
Figure 4:
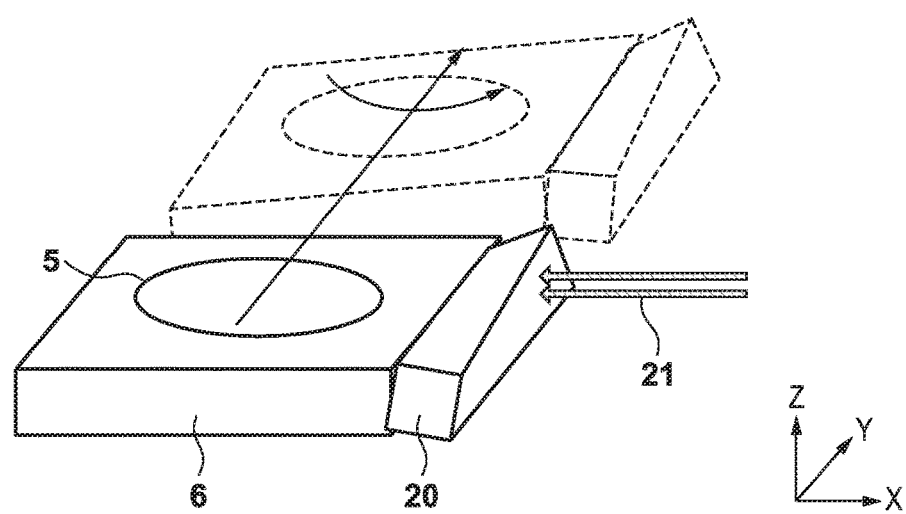
FIG. 4 is a perspective view showing a state in which distortion is caused in a mirror provided on a substrate stage.

In the imprint apparatus 1, however, for example, distortion of the base plate 15, which is moved by the substrate stage 6, at the contact position sometimes differs from that at the measurement position (FIG. 3). In addition, the substrate stage 6 is sometimes provided with a mirror 20, which reflects light 21 from a measurement device which measures the position/posture of the substrate stage 6, while the mirror 20 is distorted (FIG. 4). In such a case, if the inclination of the surface of the substrate 5 at the contact position is controlled based on the result obtained by measuring the inclination of the surface of the substrate 5 by using the first measurement unit 8 at the measurement position, it can be difficult to set the relative inclination between the pattern surface of the mold 3 and the surface of the substrate 5 to a target relative inclination. That is, it can be difficult to make the residual layer thickness of the imprint material 14 uniform.

Figure 5:
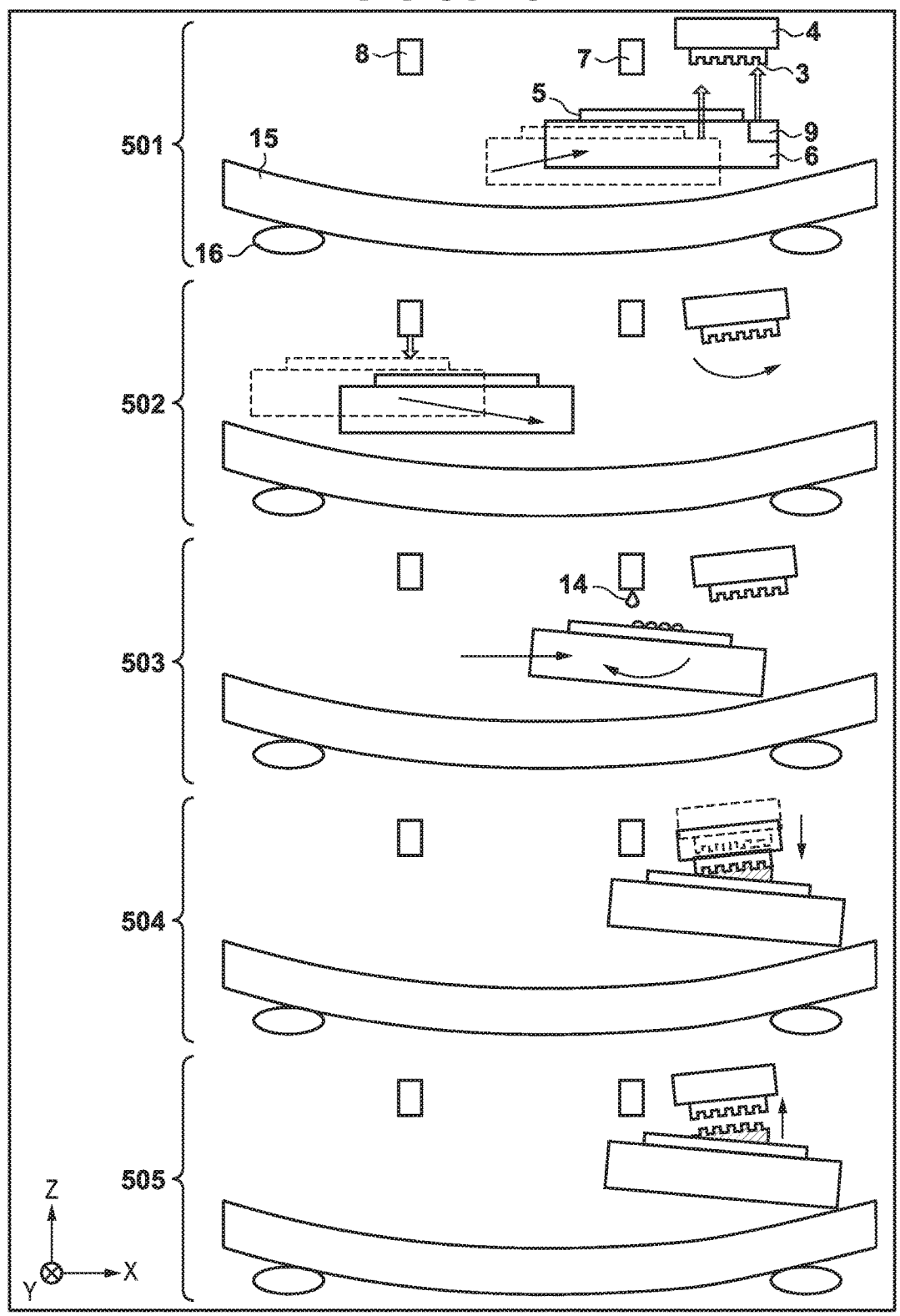
FIG. 5 is a view showing how an imprint process is performed when distortion of the base plate at a contact position differs from that at a measurement position.

An imprint process to be performed when the distortion of the base plate 15 (the inclination of the surface of the base plate 15) at the contact position differs from that at the measurement position will be described with reference to FIG. 5. FIG. 5 shows how an imprint operation is performed when the distortion of the base plate at the contact position differs from that at the measurement position. Referring to FIG. 5, for the sake of simplicity, assume that the pattern surface itself of the mold 3 and the surface itself of the substrate 5 have no inclination, and the substrate stage 6 is controlled to maintain the inclination of the surface of the substrate 5 during the movement on the base plate 15.

The control unit 10 causes the second measurement unit 9 to measure the inclination of the pattern surface of the mold 3 at the contact position by detecting the height of each of a plurality of portions on the pattern surface while moving the substrate stage 6 on the base plate 15 (501 in FIG. 5). At this time, the position of the substrate stage 6 in a direction (for example, the Z direction) parallel to the mold pressing direction changes in accordance with the distortion of the base plate 15 at the contact position. For this reason, when measuring the height of each portion on the pattern surface, the position of the second measurement unit 9 varies in the direction parallel to the mold pressing direction. This can cause an error in a measurement result obtained by the second measurement unit 9. Even if, for example, the pattern surface is perpendicular to the mold pressing direction, the second measurement unit 9 may measure that the pattern surface has inclined in accordance with the distortion of the base plate 15. Therefore, when the control unit 10 controls the inclination of the pattern surface based on the measurement result obtained by the second measurement unit 9, the inclination of the pattern surface is controlled to make the surface of the base plate 15 at the contact position become parallel to the pattern surface (502 in FIG. 5).

In addition, the control unit 10 causes the first measurement unit 8 to measure the inclination of the surface of the substrate 5 at the measurement position by detecting the height of each of a plurality of portions on the surface of the substrate 5 while moving the substrate stage 6 (substrate 5) (502 in FIG. 5). At this time, the position of the substrate stage 6 in the direction parallel to the mold pressing direction changes in accordance with the distortion of the base plate 15 at the measurement position. For this reason, when measuring the height of each portion on the surface of the substrate 5, the position of the substrate 5 varies in the direction parallel to the mold pressing direction. This can cause an error in a measurement result obtained by the first measurement unit 8. Even if, for example, the surface of the substrate 5 is perpendicular to the mold pressing direction, the first measurement unit 8 may measure that the surface of the substrate 5 has inclined in accordance with the distortion of the base plate 15. Therefore, when the control unit 10 controls the inclination of the surface of the substrate 5 based on the measurement result obtained by the first measurement unit 8, the inclination of the surface of the substrate 5 is controlled to make the surface of the base plate 15 at the contact position become parallel to the surface of the substrate 5 (503 in FIG. 5). As a consequence, when the inclination of the surface of the base plate 15 at the contact position differs from that at the measurement position, the inclination of the surface of the substrate 5 at the contact position differs from that at the measurement position. This can make it difficult to set the relative inclination between the pattern surface of the mold 3 and the surface of the substrate 5 to a target relative inclination. This can make it difficult to make the residual layer thickness of the imprint material 14 uniform after the step of supplying the imprint material 14, the step of bringing the mold 3 into contact with the imprint material 14, and the step of releasing the mold 3 (503 to 505 in FIG. 5).

For this reason, the imprint apparatus 1 according to the first embodiment controls the inclination of the surface of the substrate 5 when bringing the mold 3 into contact with the imprint material 14 at the contact position based on a value obtained by correcting a measurement result, obtained by the first measurement unit 8, using a correction value. This controls the inclination of the surface of the substrate 5 at the contact position so as to make the surface of the base plate 15 become parallel to the surface of the substrate 5 at the contact position. As a result, each of the inclinations of the pattern surface and the surface of the substrate 5 can be controlled to be parallel to the surface of the base plate 15 at the contact position. That is, the imprint apparatus 1 can control the inclination of the pattern surface of the mold 3 and the inclination of the surface of the substrate 5 to set the relative inclination between the pattern surface and the surface of the substrate 5 to a target relative inclination.

In this case, the first embodiment will exemplify a case in which the inclination of the surface of the substrate 5 is controlled based on a value obtained by correcting a measurement result, obtained by the first measurement unit 8, by using a correction value, and the inclination of the pattern surface is controlled based on a measurement result obtained by the second measurement unit 9. However, this is not exhaustive. At least one of the inclinations of the surface of the substrate 5 and the pattern surface may be controlled based on the value obtained by correcting the measurement result, obtained by the first measurement unit 8, using the correction value and the measurement result obtained by the second measurement unit 9. For example, after the inclination of the pattern surface is controlled based on the measurement result obtained by the second measurement unit 9, the inclination of the pattern surface may be further controlled based on the value obtained by correcting the measurement result, obtained by first measurement unit 8, using the correction value. In addition, for example, when the surface of the base plate 15 and the pattern surface of the mold 3 at the contact position are perpendicular to the mold pressing direction, it is not always necessary to control the inclination of the pattern surface based on the measurement result obtained by the second measurement unit 9.

[Determination of Correction Value]

Figure 6:
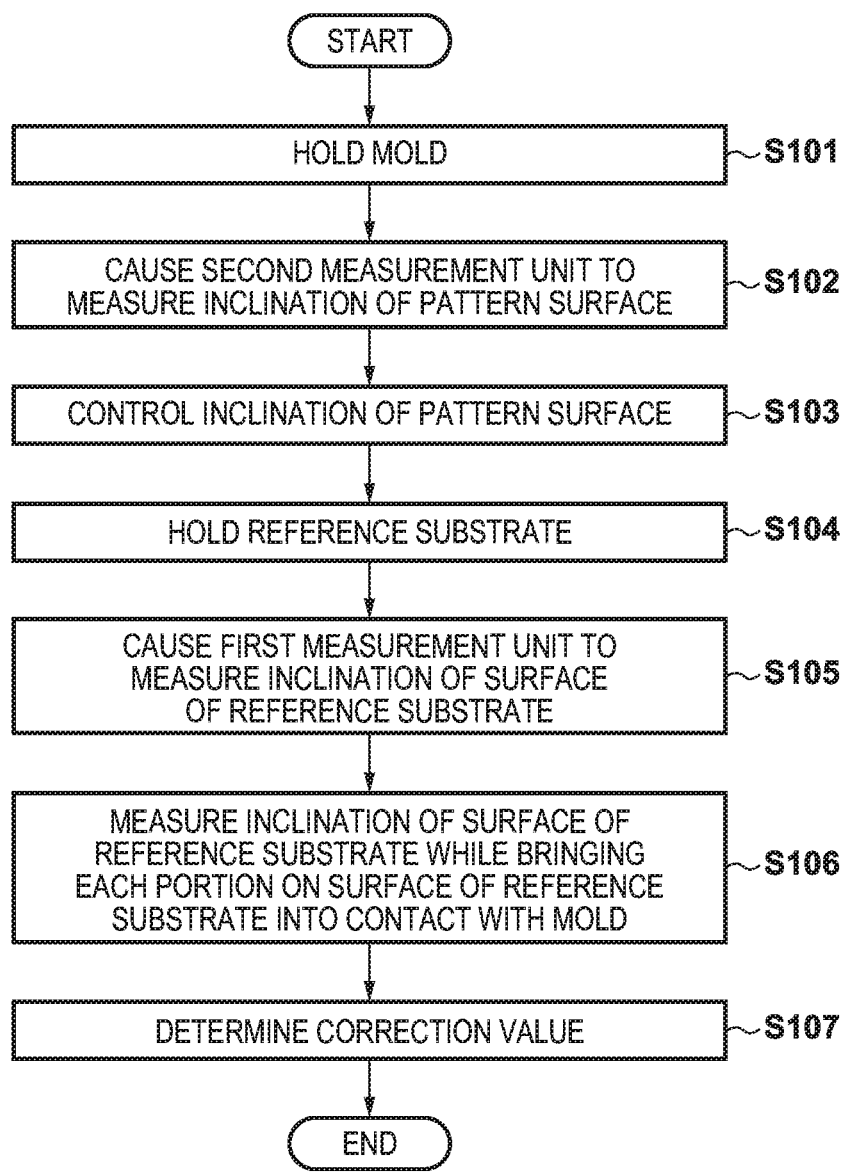
FIG. 6 is a flowchart showing a method of determining a correction value according to the first embodiment.
Figure 7:
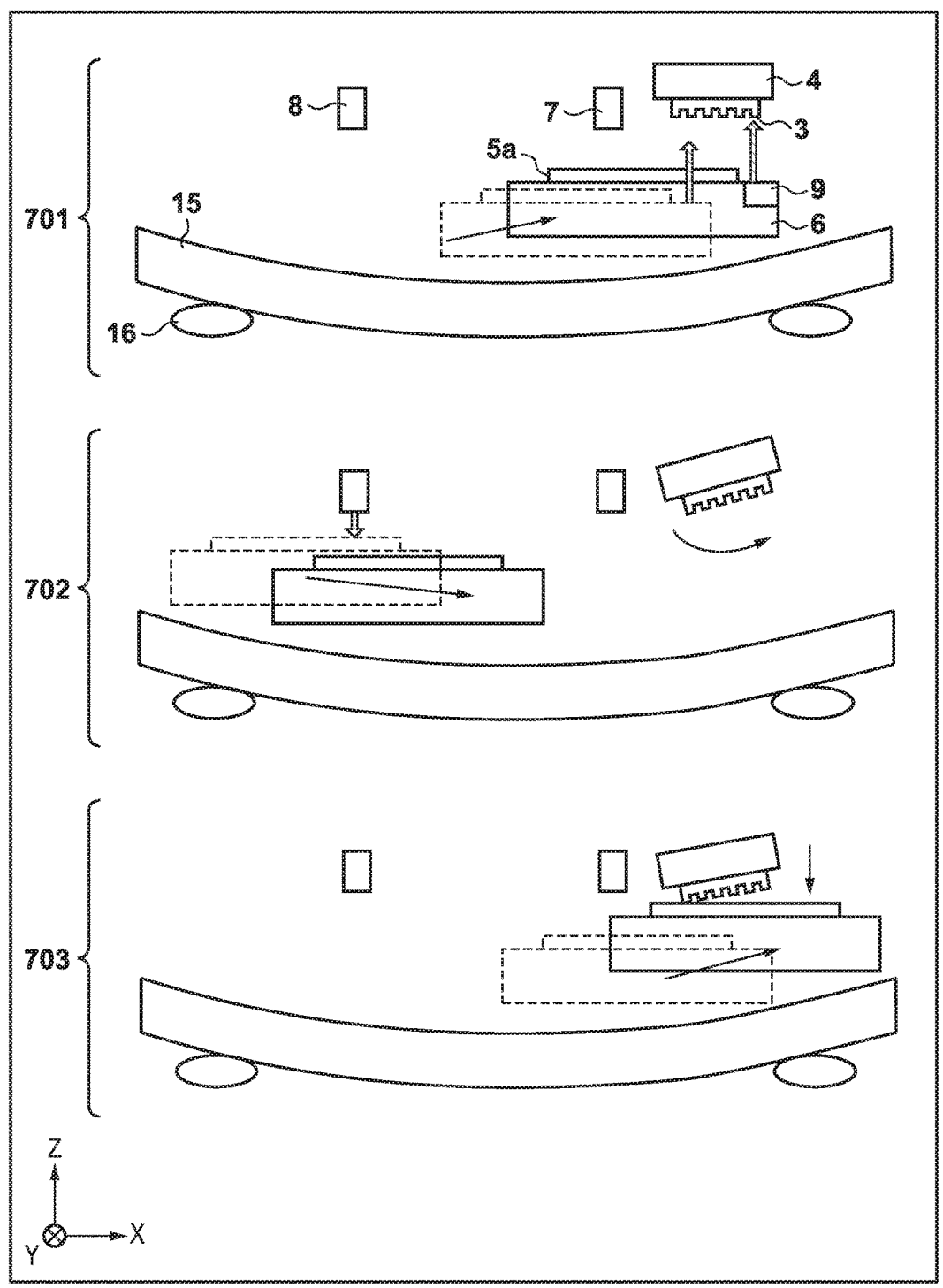
FIG. 7 is a view showing how the processing of determining a correction value is performed according to the first embodiment.

A method of determining a correction value for correcting a measurement obtained by the first measurement unit will be described next with reference to FIGS. 6 and 7. FIG. 6 is a flowchart showing a method of determining a correction value. FIG. 7 is a view showing how the processing of determining a correction value is performed. Referring to FIG. 7, for the sake of simplicity, assume that the pattern surface itself of the mold 3 and the surface itself of a reference substrate 5a have no inclination, and the substrate stage 6 is controlled to maintain the inclination of the surface of the reference substrate 5a during the movement on the base plate 15. In this case, it is possible to determine a correction value by using the reference substrate 5a before the execution of an imprint process. The surface of the reference substrate 5a used to determine a correction value may have the same shape as that of the surface of the substrate 5 for the execution of an imprint process. In addition, as the reference substrate 5a, for example, the first substrate 5 of a lot including a plurality of substrates 5 subjected to an imprint process or a dummy substrate can be used. The surface of the reference substrate 5a may be coated with, for example, a protective film or the imprint material 14.

In step S101, the control unit 10 controls the mold conveying unit 11 to convey the mold 3 to a position below the imprint head 4, and controls the imprint head 4 to hold the mold 3. In step S102, the control unit 10 causes the second measurement unit 9 to measure the inclination of the pattern surface of the mold 3 at the contact position. In step S103, the control unit 10 causes the imprint head 4 to control the inclination of the pattern surface based on the measurement result obtained by the second measurement unit 9. For example, the control unit 10 causes the second measurement unit 9 to measure the inclination of the pattern surface of the mold 3 by detecting the height of each of a plurality of portions on the pattern surface while moving the substrate stage 6 on the base plate 15, as indicated by 701 in FIG. 7. Controlling the inclination of the pattern surface based on the measurement result obtained by the second measurement unit 9 in this manner can control the inclination of the pattern surface to make the surface of the base plate 15 become parallel to the pattern surface at the contact position, as indicated by 702 in FIG. 7. In this case, steps S101 to S103 are the same as steps S111 to S113 in the flowchart of FIG. 8, and hence it is not always necessary to perform them. When performing steps S101 to S103, it is possible to omit steps S111 to S113 in the flowchart of FIG. 8.

In step S104, the control unit 10 controls the substrate conveying unit 12 to convey the reference substrate 5a onto the substrate stage 6, and controls the substrate stage 6 to hold the reference substrate 5a. In step S105, the control unit 10 causes the first measurement unit 8 to measure the inclination of the surface of the reference substrate 5a at the measurement position. For example, as indicated by 702 in FIG. 7, the control unit 10 causes the first measurement unit 8 to measure the inclination of the surface of the reference substrate 5a at the measurement position by detecting the height of each of a plurality of portions on the surface of the reference substrate 5a while moving the substrate stage 6 on the base plate 15.

In step S106, as indicated by 703 in Fig. 7, the control unit 10 measures the inclination of the surface of the reference substrate 5a at the contact position by obtaining the height of each of a plurality of portions on the surface of the reference substrate 5a while bringing the mold 3 into contact with each of the plurality of portions at the contact position. For example, the control unit 10 can obtain the height of each of a plurality of portions on the surface of the reference substrate 5a by using a moving amount by which the imprint head 4 is moved to bring the mold 3 into contact with each portion. In this case, in the first embodiment, since the imprint head 4 moves the mold 3 when changing the distance between the mold 3 and the substrate 5, the height of each portion is obtained by using the moving amount of the mold 3 (the driving amount of the mold driving unit). However, this is not exhaustive. For example, when the substrate stage 6 moves the reference substrate 5a at the time of changing the distance between the mold 3 and the substrate 5, the height of each portion may be obtained by using the moving amount of the reference substrate 5a (the driving amount of the substrate driving unit). That is, the control unit 10 may obtain the height of each of a plurality of portions on the surface of the reference substrate 5a by using a moving amount by which at least one of the mold 3 and the reference substrate 5a is moved to bring the mold 3 into contact with each portion. In addition, the surface of the reference substrate 5a used for determining a correction value need not have the same shape as that of the surface of the substrate 5 for the execution of an imprint process. The same reference substrate 5a may be used at the time of inclination measurement by the first measurement unit 8 in step S105 and at the time of inclination measurement by contact in step S106. This is because a difference in inclination measurement between different places, if exists, becomes a correction value.

In step S107, the control unit 10 determines, as a correction value, a value representing the relationship between the inclination of the surface of the reference substrate 5a at the measurement position, which is measured by the first measurement unit 8 in step S105, and the inclination of the surface of the reference substrate 5a at the contact position, which is measured in step S106. For example, the control unit 10 determines, as a correction value, the difference between the inclination of the surface of the reference substrate 5a at the measurement position, which is measured by the first measurement unit 8 in step S105, and the inclination of the surface of the reference substrate 5a at the contact position, which is measured in step S106. In this case, the inclination of the surface of the reference substrate 5a may be controlled, between steps S105 and S106, based on a measurement result obtained by the first measurement unit 8 in step S105. In this case, the control unit 10 can determine, as a correction value, the inclination of the surface of the reference substrate which is measured by bringing the mold 3 into contact with each portion on the reference substrate 5a in step S106.

[Imprint Process According to First Embodiment]

Figure 8:
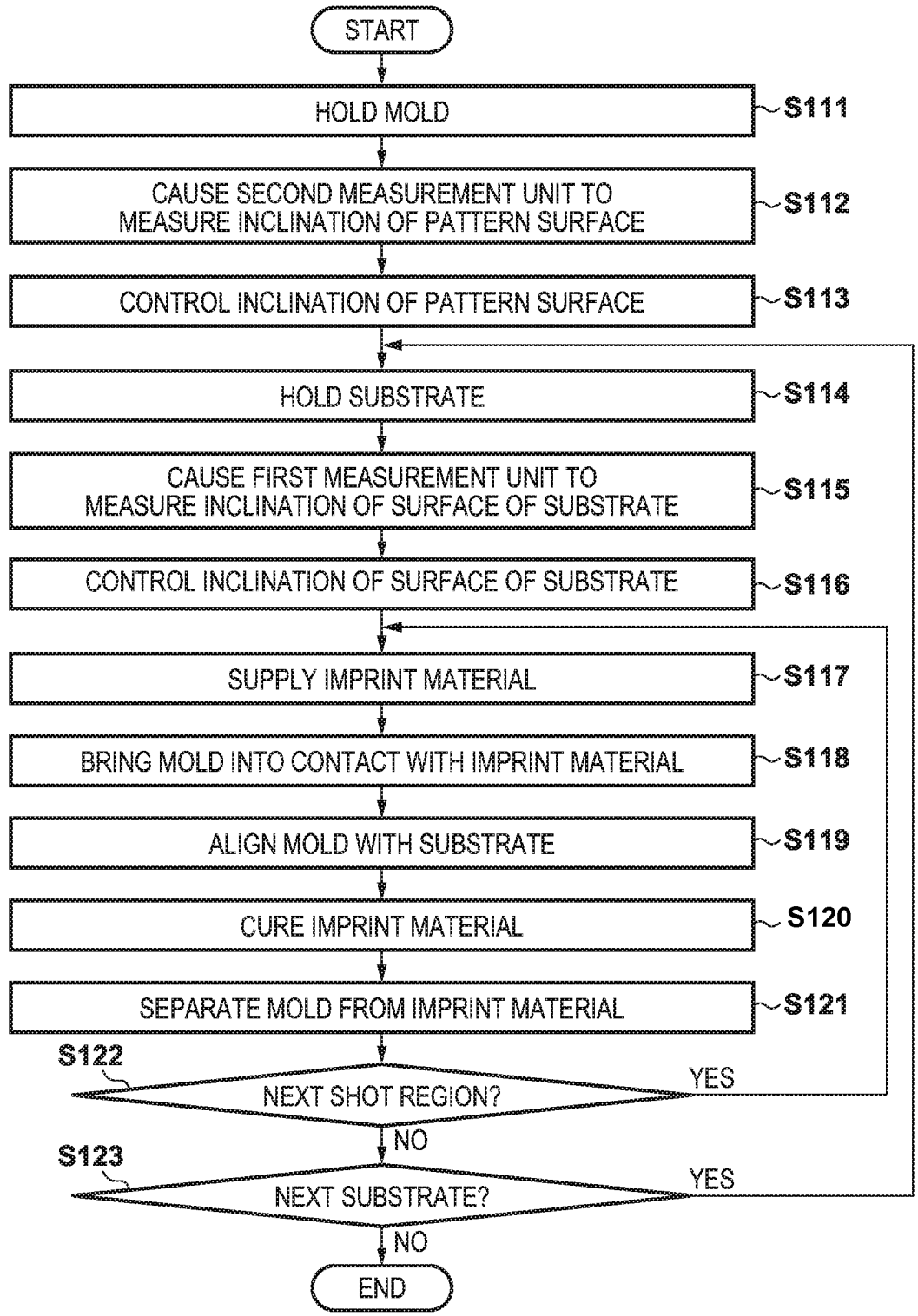
FIG. 8 is a flowchart showing an operation sequence concerning an imprint process according to the first embodiment.
Figure 9:
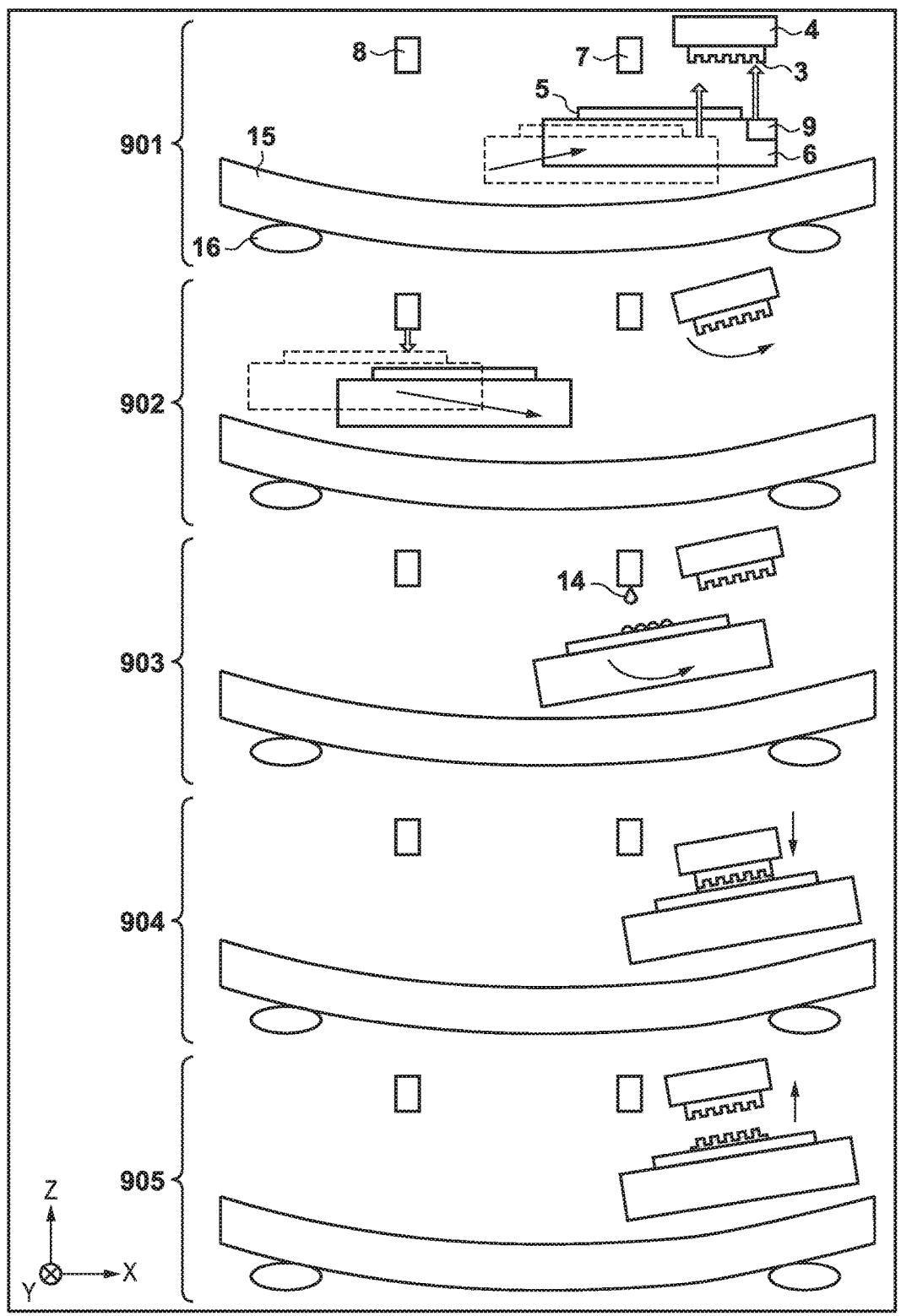
FIG. 9 is a view showing how an imprint process is performed according to the first embodiment.

An imprint process performed by the imprint apparatus 1 according to the first embodiment will be described below with reference to FIGS. 8 and 9. FIG. 8 is a flowchart showing an operation sequence for an imprint process according to the first embodiment. FIG. 9 is a view showing how an imprint process according to the first embodiment is performed. Referring to FIG. 9, for the sake of simplicity, assume that the pattern surface itself of the mold 3 and the surface itself of the substrate 5 have no inclination, and the substrate stage 6 is controlled to maintain the inclination of the surface of the substrate 5 during the movement on the base plate 15.

In step S111, the control unit 10 controls the mold conveying unit 11 to convey the mold 3 to a position below the imprint head 4, and controls the imprint head 4 to hold the mold 3. In step S112, the control unit 10 causes the second measurement unit 9 to measure the inclination of the pattern surface of the mold 3 at the contact position. In step S113, the control unit 10 causes the imprint head 4 to control the inclination of the pattern surface based on the measurement result obtained by the second measurement unit 9. For example, as indicated by 901 in FIG. 9, the control unit 10 causes the second measurement unit 9 to measure the inclination of the pattern surface of the mold 3 by detecting the height of each of a plurality of portions on the pattern surface while moving the substrate stage 6 on the base plate 15. The control unit 10 then controls the inclination of the pattern surface to, for example, make the pattern surface become perpendicular to the mold pressing direction based on the measurement result obtained by the second measurement unit 9. At this time, the measurement result obtained by the second measurement unit 9 contains an error corresponding to the distortion of the base plate 15, and hence the pattern surface is inclined so as to make the surface of the base plate 15 at the contact position become parallel to the pattern surface, as indicated by 902 in FIG. 9.

In step S114, the control unit 10 controls the substrate conveying unit 12 to convey the substrate 5 subjected to an imprint process onto the substrate stage 6, and controls the substrate stage 6 to hold the substrate 5. In step S115, the control unit 10 causes the first measurement unit 8 to measure the inclination of the surface of the substrate 5 at the measurement position. In step S116, the control unit 10 causes the substrate stage 6 to control the inclination of the surface of the substrate 5 when bringing the mold 3 into contact with the imprint material 14 at the contact position based on a value obtained by correcting the measurement result, obtained by the first measurement unit 8, using a correction value.

For example, as indicated by 902 in FIG. 9, the control unit 10 causes the first measurement unit 8 to measure the inclination of the surface of the substrate 5 by detecting the height of each of a plurality of portions on the surface of the substrate 5 while moving the substrate stage 6 on the base plate 15. The control unit 10 controls the inclination of the surface of the substrate 5 so as to make the surface of the substrate 5 become perpendicular to the mold pressing direction based on a value obtained by correcting the measurement value, obtained by the first measurement unit 8, using a correction value. When the inclination of the surface of the substrate 5 is controlled based on a value obtained by correcting the measurement result, obtained by the first measurement unit 8, using a correction value, the surface of the substrate 5 is inclined to make the surface of the base plate 15 become parallel to the surface of the substrate 5 at the contact position, as indicated by 903 in FIG. 9. As a result, the inclination of the pattern surface and the inclination of the substrate 5 are controlled to make each surface become parallel to the surface of the base plate 15 at the contact position. That is, the control unit 10 can control the inclination of the pattern surface of the mold 3 and the inclination of the surface of the substrate 5 so as to set the relative inclination between the pattern surface and the surface of the substrate 5 to a target relative inclination (for example, parallel). In this case, according to the first embodiment, the inclination of the surface of the substrate 5 is controlled based on a value obtained by correcting a measurement result, obtained by the first measurement unit 8, by using a correction value. However, this is not exhaustive. For example, it is possible to control the inclination of the pattern surface instead of the inclination of the surface of the substrate 5. That is, it is possible to control the relative inclination between the pattern surface and the surface of the substrate 5 based on a value obtained by correcting the measurement result, obtained by the first measurement unit 8, using a correction value.

In step S117, as indicated by 903 in FIG. 9, the control unit 10 controls the substrate stage 6 so as to arrange a shot region (target shot region) subjected to an imprint process at a position below the supply unit 7. The control unit 10 then controls the supply unit 7 to supply the imprint material 14 onto the target shot region. In step S118, the control unit 10 controls the substrate stage 6 to arrange the target shot region at a position below the pattern surface of the mold 3. As indicated by 904 in FIG. 9, the control unit 10 controls the imprint head 4 so as to reduce the distance between the mold 3 and the substrate 5, thereby bringing the mold 3 into contact with the imprint material 14 supplied onto the target shot region. In step S119, the control unit 10 aligns the mold 3 with the substrate 5 (X-Y direction) based on a detection result obtained by the detection unit 13 while the mold 3 is in contact with the imprint material 14. In step S120, the irradiation unit 2 is controlled to irradiate, with the light 2a (ultraviolet light), the imprint material 14 with which the mold 3 is brought into contact, thereby curing the imprint material 14.

In step S121, as indicated by 905 in FIG. 9, the control unit 10 controls the imprint head 4 to increase the distance between the mold 3 and the substrate 5, thereby separating (releasing) the mold 3 from the cured imprint material 14. In step S122, the control unit 10 determines whether there is any shot region (next shot region), on the substrate, onto which the pattern of the mold 3 is to be subsequently transferred. If there is the next shot region, the process advances to step S117. If there is no next shot region, the process advances to step S123. In step S123, the control unit 10 subsequently determines whether there is the substrate 5 (next substrate 5) onto which the pattern of the mold 3 is to be subsequently transferred. If there is the next substrate 5, the process advances to step S114. In there is no next substrate 5, the processing is terminated.

As described above, the imprint apparatus 1 according to the first embodiment controls the inclination of the surface of the substrate 5, when bringing the mold 3 into contact with the imprint material 14 at the contact position, based on a value obtained by correcting the measurement result, obtained by the first measurement unit 8, using a correction value. This makes it possible to accurately control the relative inclination between the pattern surface of the mold 3 and the surface of the substrate 5 at the contact position even if, for example, the distortion of the base plate 15 at the contact position differs from that at the measurement position. In this case, according to the first embodiment, when determining a correction value, the inclination of the surface of the reference substrate 5a at the contact position is measured by bringing the mold 3 into contact with each portion on the reference substrate 5a at the contact position. However, this is not exhaustive. For example, the imprint head 4 may hold a measurement device for measuring the inclination of the surface of the reference substrate 5a instead of the mold 3 to make the measurement device measure the inclination of the surface of the reference substrate 5a at the contact position. In this case, it is possible to determine, as a correction value, the difference between a measurement result obtained by the measurement device and a measurement result obtained by the first measurement unit 8.

<Second Embodiment>

An imprint apparatus according to the second embodiment of the present invention will be described. The inclination of the surface of a substrate 5 subjected to an imprint process sometimes varies depending on the position on the surface of the substrate 5. In this case, the relative inclination between the pattern surface of a mold 3 and the surface of the substrate 5 may be controlled by using a correction value determined in accordance with a position (the position of a target shot region) on the surface of the substrate 5 subjected to an imprint process (a position of a target shot region). For this reason, the imprint apparatus according to the second embodiment determines the distribution of correction values corresponding to positions on the surface of the substrate 5 subjected to an imprint process, and obtains a corrected distribution by correcting the distribution of inclinations of the surface of the substrate 5, measured by a first measurement unit 8, by using the distribution of correction values. A value corresponding to the position of a target shot region on the surface of the substrate 5 is extracted from the obtained corrected distribution, and the relative inclination between the pattern surface of the mold 3 and the surface of the substrate 5 is controlled based on the value. In this case, since the imprint apparatus according to the second embodiment has the same apparatus arrangement as that of the imprint apparatus 1 according to the first embodiment, a description of the apparatus arrangement will be omitted.

[Determination of Correction Value]

Figure 10:
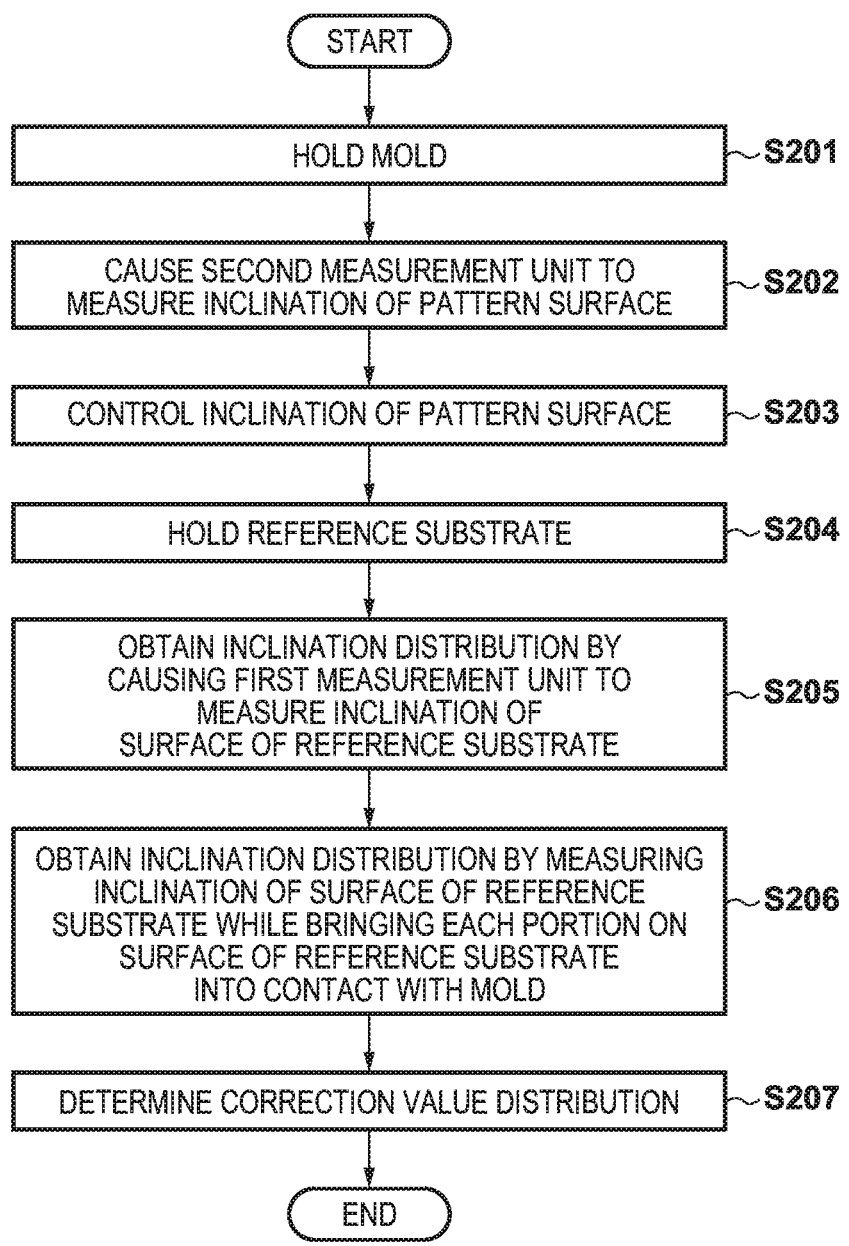
FIG. 10 is a flowchart showing a method of determining a correction value according to the second embodiment.

The determination of a correction value by the imprint apparatus according to the second embodiment will be described first with reference to FIG. 10. FIG. 10 is a flowchart showing a method of determining a correction value. Steps S201 to S204 are the same as steps S101 to S104 in the flowchart of FIG. 6 described in the first embodiment, and hence a description of them will be omitted. In addition, the surface of the reference substrate 5a used for determining a correction value may have the same shape as that of the surface of the substrate 5 subjected an imprint process.

Figure 11:
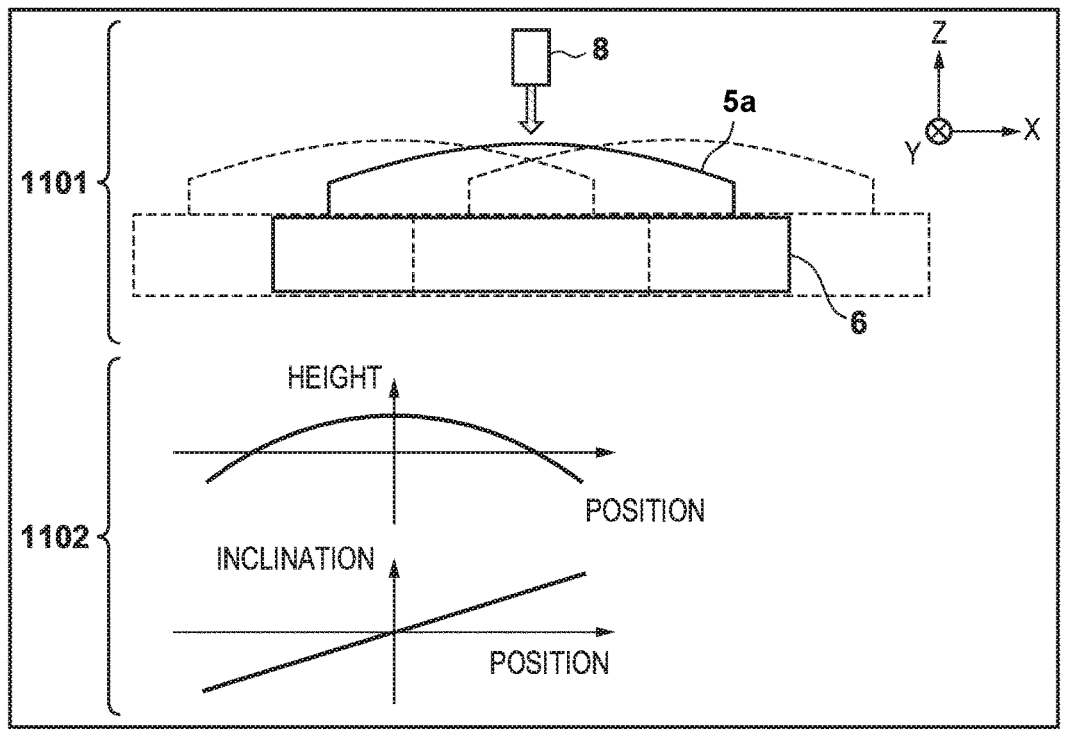
FIG. 11 is a view showing how a first measurement unit measures the inclination of the surface of a reference substrate.

In step S205, as indicated by 1101 in FIG. 11, a control unit 10 causes the first measurement unit 8 to detect the height of each of a plurality of portions on the surface of a reference substrate 5a at the measurement position while moving a substrate stage 6 on a base plate 15. As indicated by 1102 in FIG. 11, the control unit 10 obtains an inclination distribution (for example, an approximate function) corresponding to positions on the surface of the reference substrate 5a from a height distribution corresponding to the positions on the surface of the reference substrate 5a. For example, the control unit 10 can obtain an inclination distribution corresponding to the positions on the surface of the reference substrate 5a by performing differential processing with respect to the height distribution. When there are a plurality of regions with different inclinations, the control unit 10 may cause the first measurement unit 8 to measure the height of each of at least two portions in each region.

Figure 12:
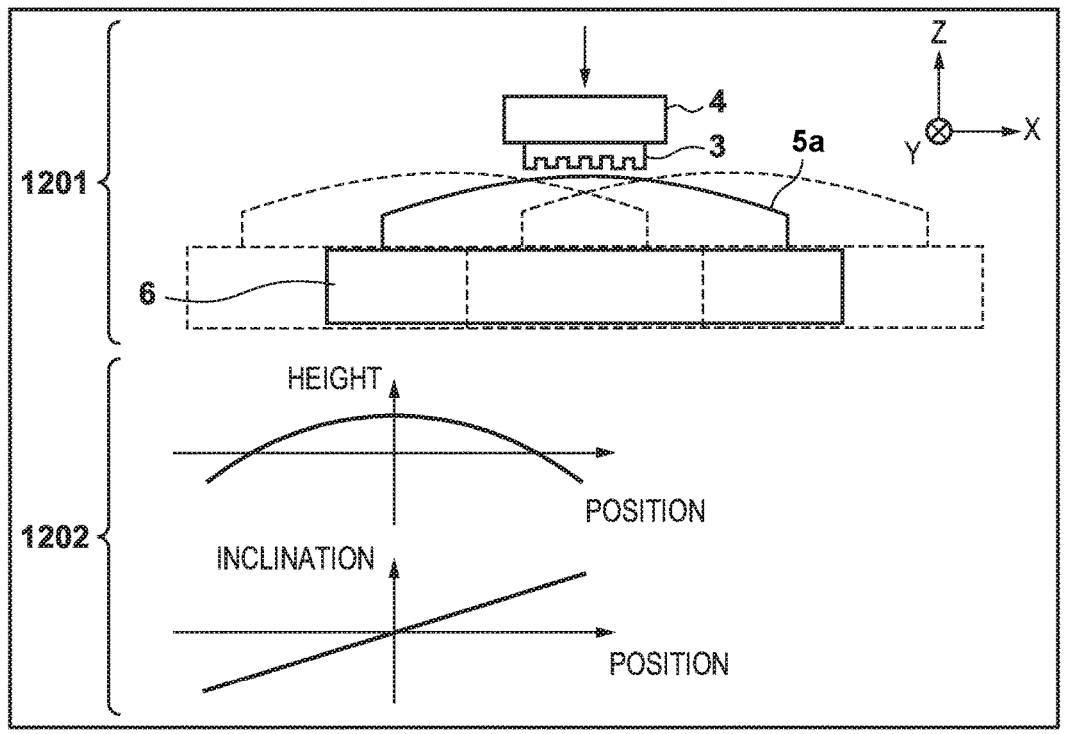
FIG. 12 is a view showing how the inclination of the surface of the reference substrate is measured by bringing a mold into contact with the reference substrate.

In step S206, as indicated by 1201 in FIG. 12, the control unit 10 obtains the height of each of a plurality of portions on the surface of the reference substrate 5a at the contact position by bringing the mold 3 into contact with each of the plurality of portions while moving the substrate stage 6 on the base plate 15. As indicated by 1202 in FIG. 12, the control unit 10 obtains an inclination distribution (for example, an approximate function) corresponding to positions on the surface of the reference substrate 5a from a height distribution corresponding to the positions on the surface of the reference substrate 5a. In step S207, the control unit 10 determines a distribution representing the relationship (for example, the difference) between the inclination distribution obtained in step S205 and the inclination distribution obtained in step S206 as the distribution of correction values corresponding to the positions on the surface of the substrate.

[Imprint Process According to Second Embodiment]

Figure 13:
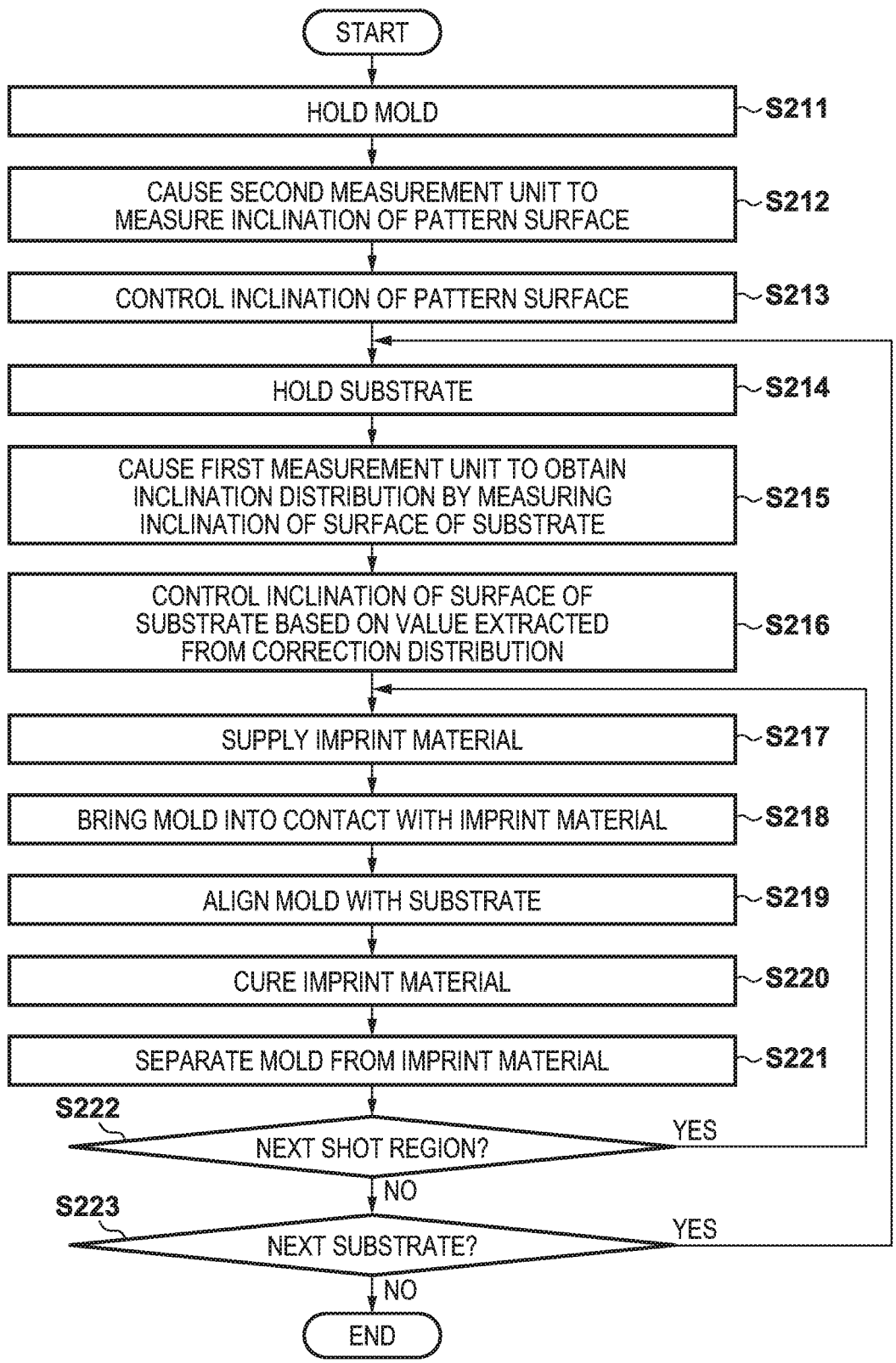
FIG. 13 is a flowchart showing an operation sequence concerning an imprint process according to the second embodiment.

An imprint process by the imprint apparatus according to the second embodiment will be described next with reference to FIG. 13. FIG. 13 is a flowchart showing an operation sequence for an imprint process according to the second embodiment. The flowchart shown in FIG. 13 differs from the flowchart shown in FIG. 6, described in the first embodiment, in steps S215 and S216. For this reason, steps S215 and S216 will be described below, and a description of the remaining steps will be omitted.

In step S215, the control unit 10 causes the first measurement unit 8 to detect the height of each of a plurality of portions on the surface of the substrate 5 at the measurement position while moving the substrate stage 6 on the base plate 15. The control unit 10 then obtains an inclination distribution (for example, an approximate function) corresponding to positions on the surface of the substrate 5 from a height distribution corresponding to the positions on the surface of the substrate 5. In step S216, the control unit 10 adds the distribution of correction values corresponding to the positions on the surface of the substrate to the inclination distribution obtained in step S215, thereby generating the distribution of values (to be referred to as a corrected distribution hereinafter) obtained by correcting the measurement results, obtained by the first measurement unit 8, using the correction values. The control unit 10 extracts, from the corrected distribution, a value corresponding to a position on the surface of the substrate on which a target shot region is arranged, and causes the substrate stage 6 to control the inclination of the surface of the substrate 5 based on the extracted value. This makes it possible to control the inclination of the pattern surface and the inclination of the surface of the substrate 5 at the contact position, even if the inclination of the surface of the substrate 5 in accordance with a position on the surface of the substrate 5, so as to set the relative inclination between the pattern surface of the mold 3 and the surface of the substrate 5 to a target relative inclination (for example, parallel).

<Third Embodiment>

Figure 14:
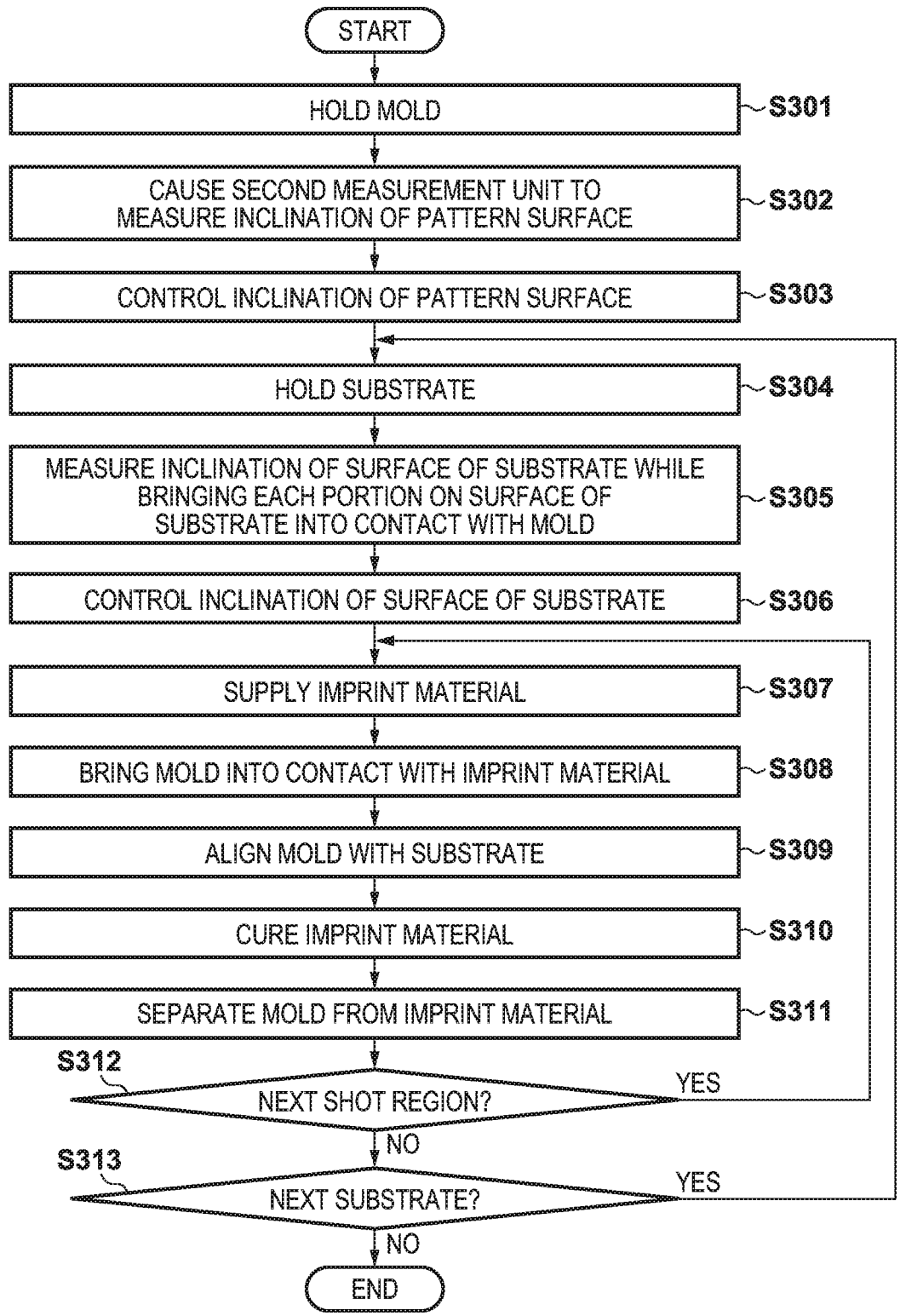
FIG. 14 is a flowchart showing an operation sequence concerning an imprint apparatus according to the third embodiment.

With an increase in the complexity of the apparatus arrangement of an imprint apparatus, it is becoming difficult to arrange a measurement unit for measuring the inclination of the surface of a substrate near the contact position where a mold is brought into contact with an imprint material. For this reason, it is desirable for an imprint apparatus to measure the inclination of the surface of a substrate at a contact position without using the measurement unit. The imprint apparatus according to the third embodiment measures the inclination of the surface of the substrate 5 by obtaining the height of each of a plurality of portions on the surface of a substrate 5 subjected to an imprint process by bringing the mold 3 into contact with each of the plurality of portions without using a first measurement unit 8. FIG. 14 is a flowchart showing an operation sequence for an imprint process according to the third embodiment. In this case, since the imprint apparatus according to the third embodiment has the same apparatus arrangement as that of the imprint apparatus 1 according to the first embodiment, a description of the apparatus arrangement will be omitted. In addition, the imprint apparatus according to the third embodiment may not be provided with the first measurement unit 8 because the inclination of the surface of the substrate 5 is obtained without using the first measurement unit 8.

In step S301, a control unit 10 controls a mold conveying unit 11 to convey the mold 3 to a position below an imprint head 4, and controls the imprint head 4 to hold the mold 3. In step S302, the control unit 10 causes a second measurement unit 9 to measure the inclination of the pattern surface of the mold 3 at the contact position (first position) where the mold 3 is brought into contact with an imprint material 14. In step S303, the control unit 10 controls the inclination of the pattern surface by using the imprint head 4 based on the measurement result obtained by the second measurement unit 9. For example, the control unit 10 causes the second measurement unit 9 to measure the inclination of the pattern surface of the mold 3 by detecting the height of each of a plurality of portions on the pattern surface while moving a substrate stage 6 on a base plate 15. The control unit 10 controls the inclination of the pattern surface so as to make, for example, the pattern surface become perpendicular to the mold pressing direction based on the measurement result obtained by the second measurement unit 9. At this time, since the measurement result obtained by the second measurement unit 9 contains an error corresponding to the distortion of the base plate 15, the pattern surface is inclined to become parallel to the surface of the base plate 15 at the contact position. In this case, for example, when the surface of the base plate 15 and the pattern surface of the mold 3 are perpendicular to the mold pressing direction at the contact position, it is not always necessary to control the inclination of the pattern surface based on the measurement result obtained by the second measurement unit 9.

In step S304, the control unit 10 controls a substrate conveying unit 12 to convey the substrate 5 onto the substrate stage 6, and controls the substrate stage 6 to hold the substrate 5. In step S305, the control unit 10 measures the inclination of the surface of the substrate 5 at the contact position by obtaining the height of each of a plurality of portions on the surface of the substrate 5 by bringing the mold 3 into contact with each of the plurality of portions. For example, the control unit 10 causes the imprint head 4 to move the mold 3 so as to bring the mold 3 into contact with each of a plurality of portions on the surface of the substrate 5, and can obtain the height of each portion by using the moving amount at this time. In this case, according to the third embodiment, since the imprint head 4 moves the mold 3 when changing the distance between the mold 3 and the substrate, the height of each portion is obtained by using the moving amount of the mold 3 (the driving amount of the mold driving unit). However, this is not exhaustive. For example, when the substrate stage 6 moves the substrate 5 to change the height between the mold 3 and the substrate 5, the height of each portion may be obtained by using the moving amount of the substrate 5 (the driving amount of the substrate driving unit). That is, the control unit 10 may obtain the height of each of a plurality of portions on the surface of the substrate 5 by using a moving amount by which at least one of the mold 3 and the substrate 5 is moved to bring the mold 3 into contact with each of the plurality of portions on the surface of the substrate 5.

In step S306, the control unit 10 controls the inclination of the surface of the substrate 5 by using the substrate stage 6 based on the result obtained by measuring the inclination of the surface of the substrate 5 in step S305. At this time, since the result obtained by measuring the inclination of the surface of the substrate in step S405 contains an error caused by the distortion of the base plate 15, the surface of the substrate 5 is inclined to become parallel to the surface of the base plate 15 at the contact position. With this operation, the control unit 10 can control the inclination of the pattern surface of the mold 3 and the inclination of the surface of the substrate 5 so as to set the relative inclination between the pattern surface and the surface of the substrate 5 to a target relative inclination (for example, parallel).

In step S307, the control unit 10 controls the substrate stage 6 to arrange a shot region (target shot region) subjected to an imprint process at a position below the supply unit 7, and controls the supply unit 7 to supply the imprint material 14 onto the target shot region. In step S308, the control unit 10 controls the substrate stage 6 to arrange the target shot region at a position below the pattern surface of the mold 3. The control unit 10 then controls the imprint head 4 to reduce the distance between the mold 3 and the substrate 5 so as to bring the mold 3 into contact with the imprint material 14 supplied onto the target shot region. In step S309, the control unit 10 aligns the mold 3 with the substrate 5 (in the X-Y direction) based on a detection result obtained by the detection unit 13 while the mold 3 is in contact with the imprint material 14. In step S310, the control unit 10 controls an irradiation unit 2 to irradiate the imprint material 14, with which the mold 3 is in contact, with light 2a (ultraviolet light), thereby curing the imprint material 14.

In step S311, the control unit 10 controls the imprint head 4 to increase the distance between the mold 3 and the substrate 5 so as to separate (release) the mold 3 from the cured imprint material 14. In step S312, the control unit 10 determines whether there is any shot region (next shot region), on the substrate, onto which the pattern of the mold 3 is to be transferred. If there is a next shot region, the process advances to step S307. If there is no next shot region, the process advances to step S313. In step S313, the control unit 10 determines whether there is any substrate 5 (next substrate 5) onto which the pattern of the mold 3 is to be subsequently transferred. If there is the next substrate 5, the process advances to step S304. If there is no next substrate 5, the processing is terminated.

As described above, the imprint process according to the third embodiment measures the inclination of the surface of the substrate 5 by obtaining the height of each of a plurality of portions on the surface of the substrate 5 while bringing the mold 3 into contact with each portion on the surface of the substrate 5. The apparatus then controls the inclination of the surface of the substrate 5 based on a result obtained by measuring the inclination of the surface of the substrate 5. With this operation, it is possible to accurately control the relative inclination between the pattern surface of the mold 3 and the surface of the substrate 5 at the contact position where the mold 3 is brought into contact with the imprint material 14.

<Embodiment of Method of Manufacturing Article>

A method of manufacturing an article according to an embodiment of the present invention is suitable for manufacturing an article such as a microdevice such as a semiconductor device or an element having a microstructure. This method of manufacturing an article according to this embodiment can include a step of forming a pattern on an imprint material supplied onto a substrate by using the above imprint apparatus (a step of performing an imprint process on the substrate) and a step of processing the substrate on which the pattern has been formed in the preceding step. The manufacturing method further includes other known steps (oxidation, film formation, deposition, doping, planarization, etching, resist removal, dicing, bonding, packaging, and the like). The method of manufacturing an article according to this embodiment is superior to the conventional method in at least one of the performance of an article, quality, productivity, and production cost.

<Other Embodiments>

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment (s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-000512 filed on Jan. 5, 2015, which is hereby incorporated by reference herein in its entirety.

What is claimed is:

1. An imprint apparatus which forms an imprint material on a substrate by using a mold, the apparatus comprising:
 a stage configured to be movable along a surface of a base plate, while holding the substrate;
 a driver configured to relatively drive the mold and the substrate so as to bring the mold and the imprint material on the substrate into contact with each other, in a state where the stage is arranged on a first position of the base plate, wherein the stage arranged on the first position is located below the mold;
 a measurement device configured to measure an inclination of the substrate held by the stage in a state where the stage is arranged on a second position of the base plate different from the first position, wherein the stage arranged on the second position is not located below the mold; and
 a controller configured to control a relative inclination between the mold and the substrate when bringing the mold into contact with the imprint material in a state where the stage is arranged on the first position, based on information representing a difference of inclinations of the substrate at the first position and the second position, and the inclination of the substrate measured by the measurement device.

2. The apparatus according to claim 1, wherein the controller is configured to determine an inclination of the substrate in the state where the stage is arranged on the first position, based on heights of a plurality of points on the substrate obtained by bringing the mold into contact with each of the plurality of points, and generate the information based on the determined inclination of the substrate in the state where the stage is arranged on the first position and the inclination of the substrate measured by the measurement device in the state where the stage is arranged on the second position.

3. The apparatus according to claim 2, wherein the controller is configured to obtain the heights of the plurality of points of the substrate, based on a moving amount obtained by causing the driver to relatively drive the mold and the substrate so as to bring the mold and the substrate into contact with each other, for each of the plurality of points on the substrate.

4. The apparatus according to claim 1, wherein the measurement device is configured to measure the inclination of the substrate by detecting a height of each of a plurality of portions of the substrate in the state where the stage is arranged on the second position.

5. The apparatus according to claim 1, wherein the controller is configured to determine, based on the information, a correction value for correcting the difference between the inclination of the substrate in the state where the stage is arranged on the first position and the inclination of the substrate in the state where the stage is arranged on the second position, and control the relative inclination when bringing the mold into contact with the imprint material in the state where the stage is arranged on the first position, based on a value obtained by correcting the inclination of the substrate measured by the measurement device by the determined correction value.

6. The apparatus according to claim 5, wherein the controller is configured to determine the correction value in accordance with a position on the substrate.

7. The apparatus according to claim 5, wherein the controller is configured to determine the correction value by using a first substrate of a lot including a plurality of substrates.

8. The apparatus according to claim 1, further comprising a second measurement device configured to measure an inclination of a pattern surface of the mold,
wherein the controller is configured to control the relative inclination when bringing the mold into contact with the imprint material in a state where the stage is arranged on the first position, further based on the inclination of the pattern surface measured by the second measurement device.

9. The apparatus according to claim 8, wherein the second measurement device is provided on the stage and is configured to measure the inclination of the pattern surface by detecting a height of each of a plurality of points on the pattern surface while being moved by the stage.

10. The apparatus according to claim 1, wherein the controller is configured to determine, as the information, information representing a distribution of the difference between the inclination of the substrate in the state where the stage is arranged on the first position and the inclination of the substrate in the state where the stage is arranged on the second position.

11. The apparatus according to claim 10, wherein the controller is configured to extract, from the information, the difference corresponding to a position on the substrate of a shot region on which the pattern of the imprint material is to be formed, among the plurality of shot regions in the substrate, and control the relative inclination based on the extracted difference.

12. The apparatus according to claim 1, wherein the information is determined in advance by using a reference substrate different from the substrate.

13. The apparatus according to claim 1, further comprising an imprint head configured to hold the mold,
wherein the measurement device is located apart from the imprint head.

14. The apparatus according to claim 1, further comprising a detector configured to detect a mark on the substrate through the mold, in a state where the stage is arranged at the first position.

15. The apparatus according to claim 1, wherein the first position and the second position of the base plate are different from each other in a direction perpendicular to a driving direction for relatively driving the mold and the substrate by the driver.

16. The apparatus according to claim 1, wherein the measurement device is configured to measure the inclination of the substrate held by the stage by detecting a height of each of a plurality of portions on the substrate through a light path that does not pass through the mold.

17. A method of manufacturing an article, the method comprising:
forming a pattern of an imprint material on a substrate by using a mold and an imprint apparatus, the imprint apparatus including a stage configured to be movable on a base plate while holding the substrate; and
processing the substrate, on which the pattern has been formed, to manufacture the article,
wherein forming the pattern of the imprint material on the substrate includes:
relatively driving the mold and the substrate so as to bring the mold and the imprint material on the substrate into contact with each other, in a state where the stage is arranged on a first position of the base plate, wherein the stage arranged on the first position is located below the mold;
measuring an inclination of the substrate held by the stage in a state where the stage is arranged on a second position of the base plate different from the first position, wherein the stage arranged on the second position is not located below the mold; and
controlling a relative inclination between the mold and the substrate when bringing the mold into contact with the imprint material in a state where the stage is arranged on the first position, based on information representing a difference of inclinations of the substrate at the first position and the second position, and the measured inclination of the substrate.

* * * * *